(12) United States Patent
Betterton et al.

(10) Patent No.: US 9,752,894 B2
(45) Date of Patent: Sep. 5, 2017

(54) ELECTRIC POWER METERING EQUIPMENT

(71) Applicants: Brandon Betterton, Centre, AL (US); Clint Smith, Rainsville, AL (US)

(72) Inventors: Brandon Betterton, Centre, AL (US); Clint Smith, Rainsville, AL (US)

( * ) Notice: Subject to any disclaimer, the term of this patent is extended or adjusted under 35 U.S.C. 154(b) by 0 days.

(21) Appl. No.: 15/162,017

(22) Filed: May 23, 2016

(65) Prior Publication Data

US 2016/0341570 A1  Nov. 24, 2016

Related U.S. Application Data

(60) Provisional application No. 62/165,650, filed on May 22, 2015.

(51) Int. Cl.
| | | |
|---|---|---|
| *G08B 23/00* | (2006.01) | |
| *G08C 15/06* | (2006.01) | |
| *G01D 4/00* | (2006.01) | |
| *G01R 22/06* | (2006.01) | |

(52) U.S. Cl.
CPC ........... *G01D 4/002* (2013.01); *G01R 22/063* (2013.01); *G01R 22/065* (2013.01)

(58) Field of Classification Search
CPC ..... G01D 4/002; G01R 22/065; G01R 22/063
See application file for complete search history.

(56) References Cited

U.S. PATENT DOCUMENTS

| | | | | | |
|---|---|---|---|---|---|
| 5,588,874 | A * | 12/1996 | Pruehs | ..................... | H02B 1/03 361/668 |
| 6,921,290 | B1* | 7/2005 | Kellerman | ............. | G01R 11/04 439/517 |
| 9,041,250 | B1* | 5/2015 | Czamara | ................... | H02J 3/14 307/64 |
| 2005/0202715 | A1* | 9/2005 | Kellerman | ........... | H01R 13/193 439/517 |
| 2007/0069715 | A1* | 3/2007 | Bruno | .................. | G01R 21/133 324/76.11 |
| 2012/0062211 | A1* | 3/2012 | Neal | ....................... | G01R 11/04 324/127 |
| 2014/0362486 | A1* | 12/2014 | O'Regan | .................. | H02H 3/10 361/87 |
| 2016/0197470 | A1* | 7/2016 | Baker | .................... | H02H 9/005 174/2 |

* cited by examiner

*Primary Examiner* — Erin File
(74) *Attorney, Agent, or Firm* — Baker Donelson, PC; Royal W. Craig

(57) ABSTRACT

An improved electric power metering device that can be installed directly to and in line with the distribution line owned by a utility company or energy provider, whether for overhead or underground distribution lines. The improved electric power metering device according to the present invention thus solves many of the issues presented by prior art electricity meters that are installed in or on an individual consumer's premises, such as liability distribution and the potential for injury to the consumer or damage to the metering device based on the proximity of the metering device to the property of the consumer. The improved electric power metering device of the present invention may also be advantageously applied to the electricity distribution grid at various points that prior art meters may not be convenient or possible to install, such that service metering or RSS can be enacted at strategic points in the grid.

23 Claims, 6 Drawing Sheets

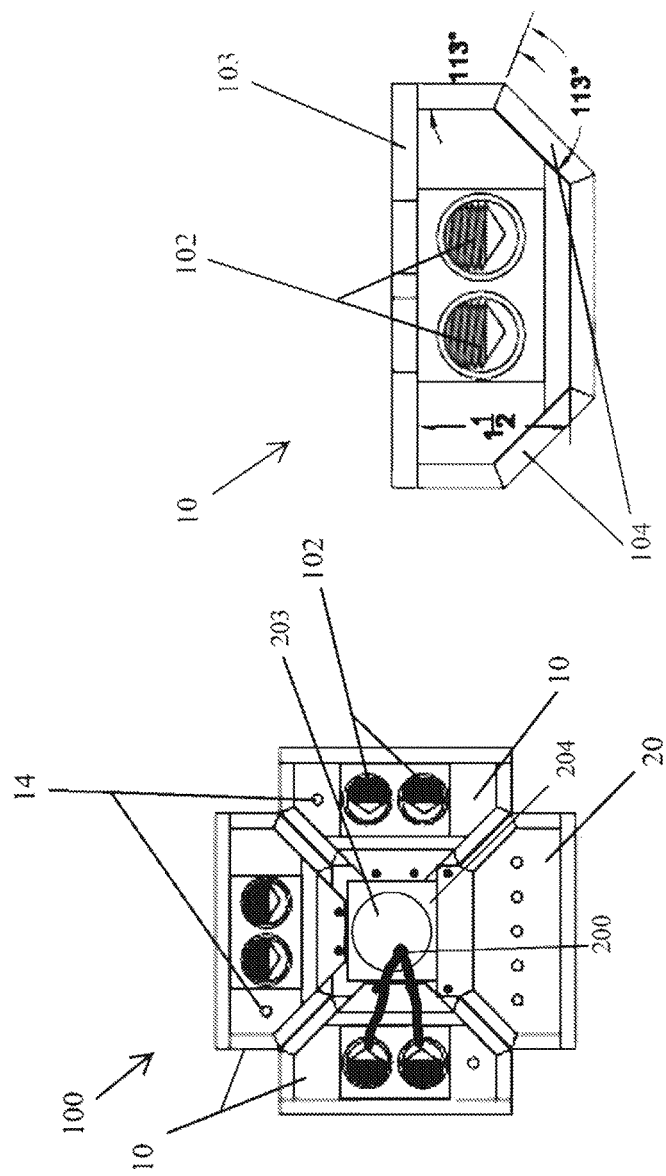

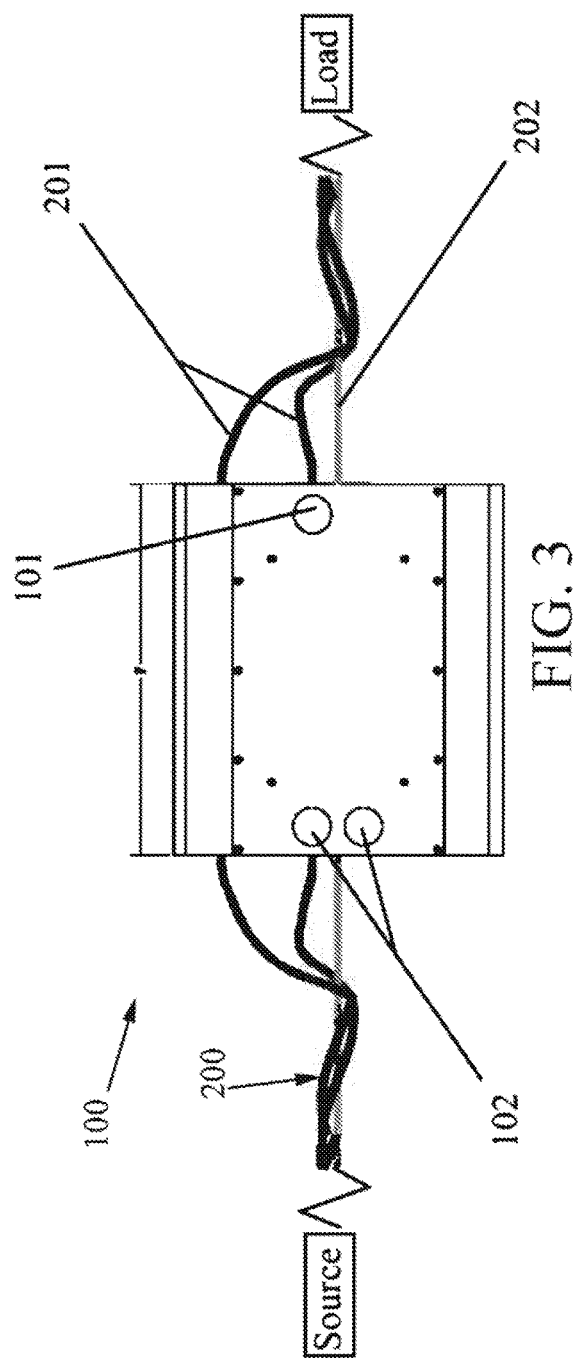
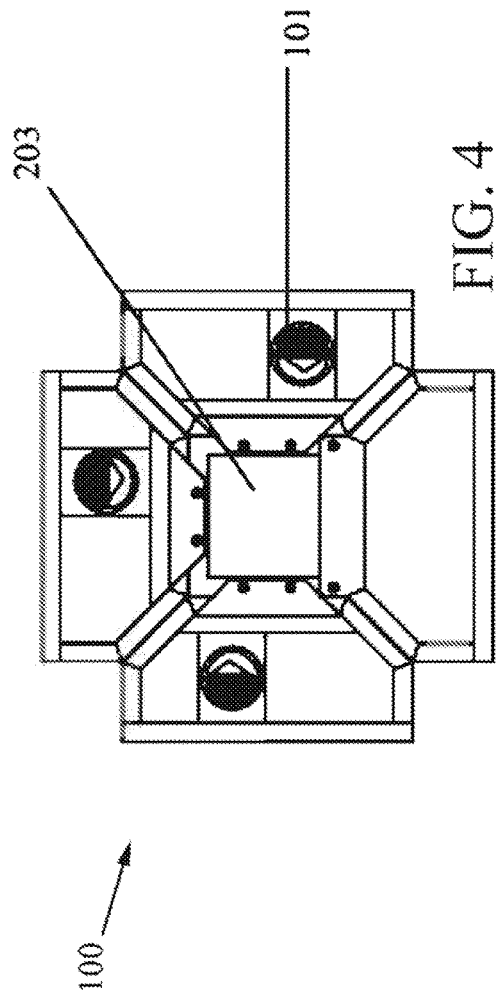

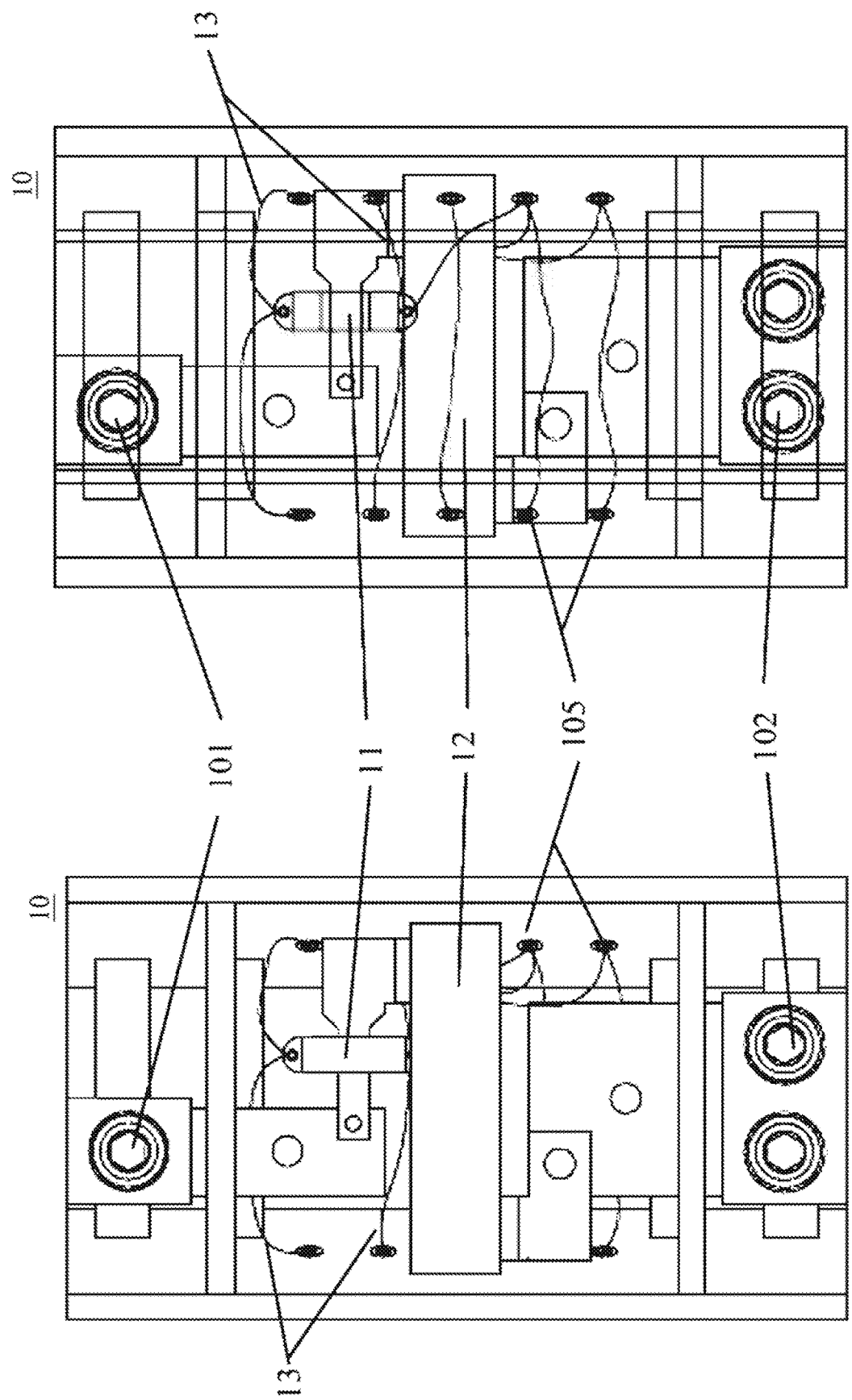

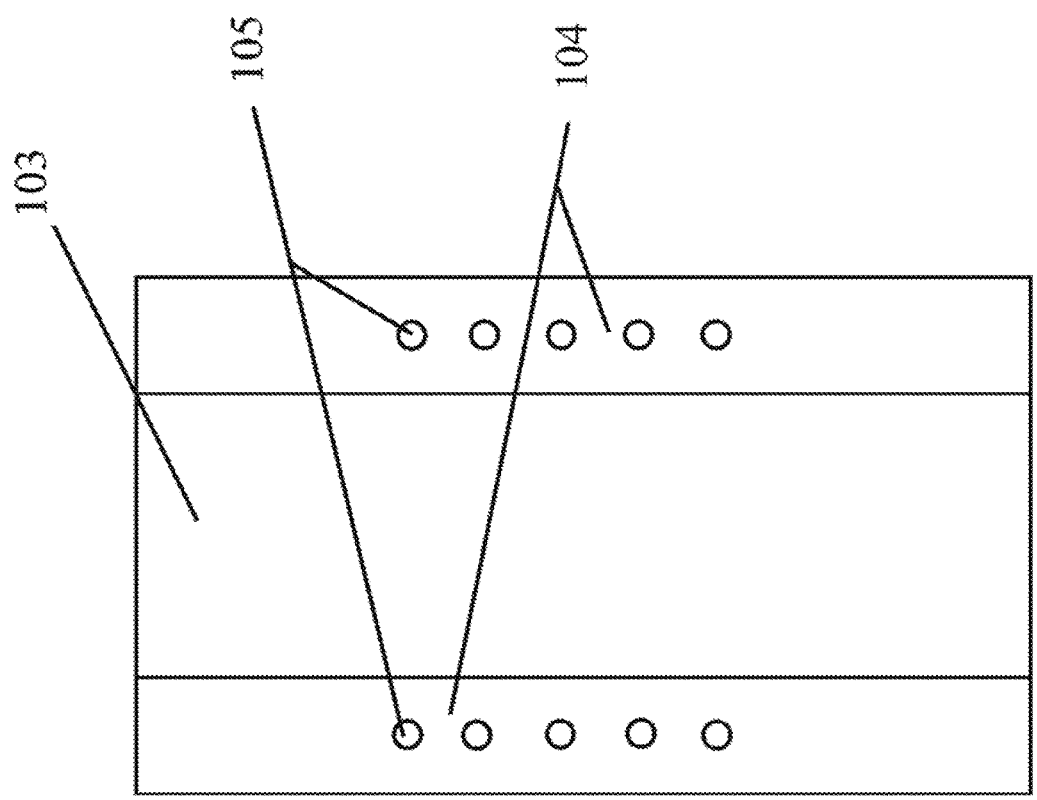
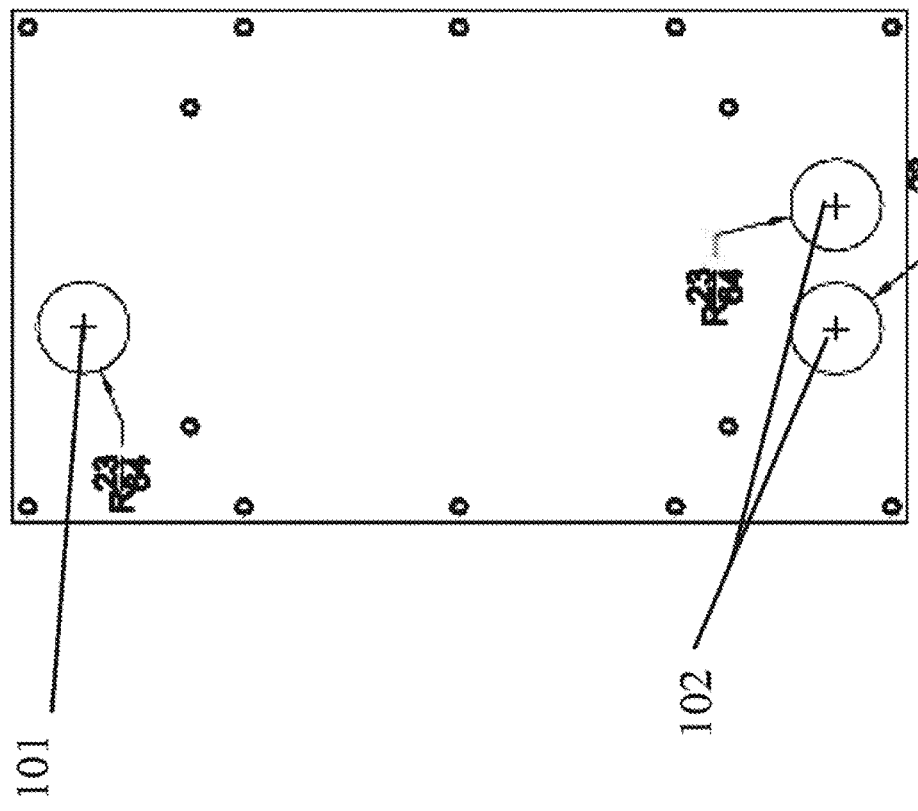
FIG. 6A
FIG. 6B

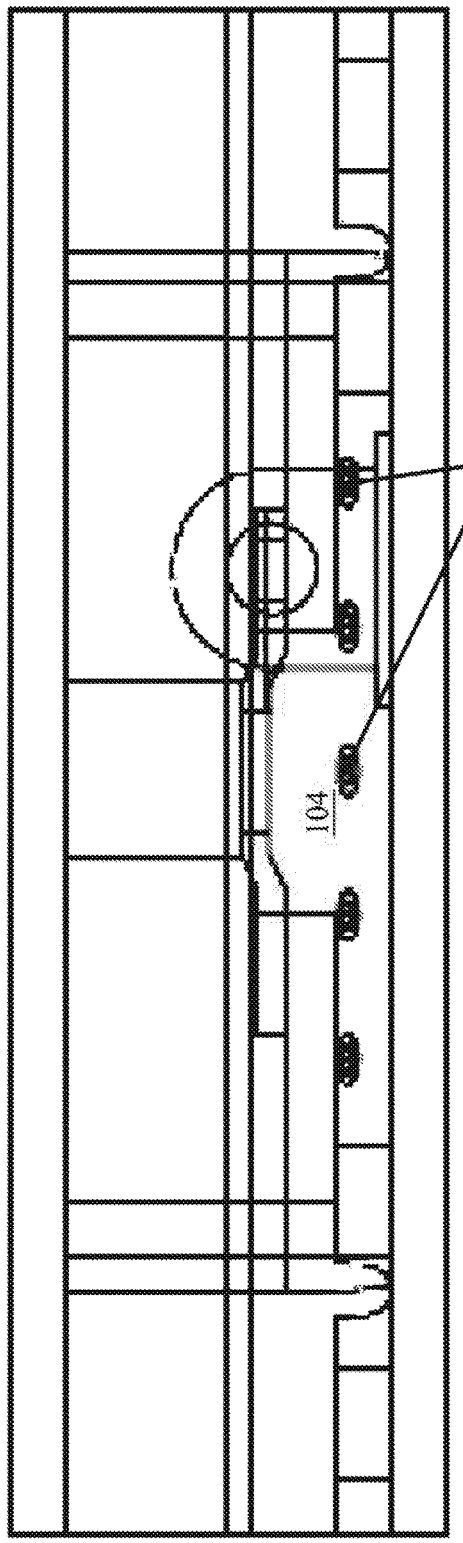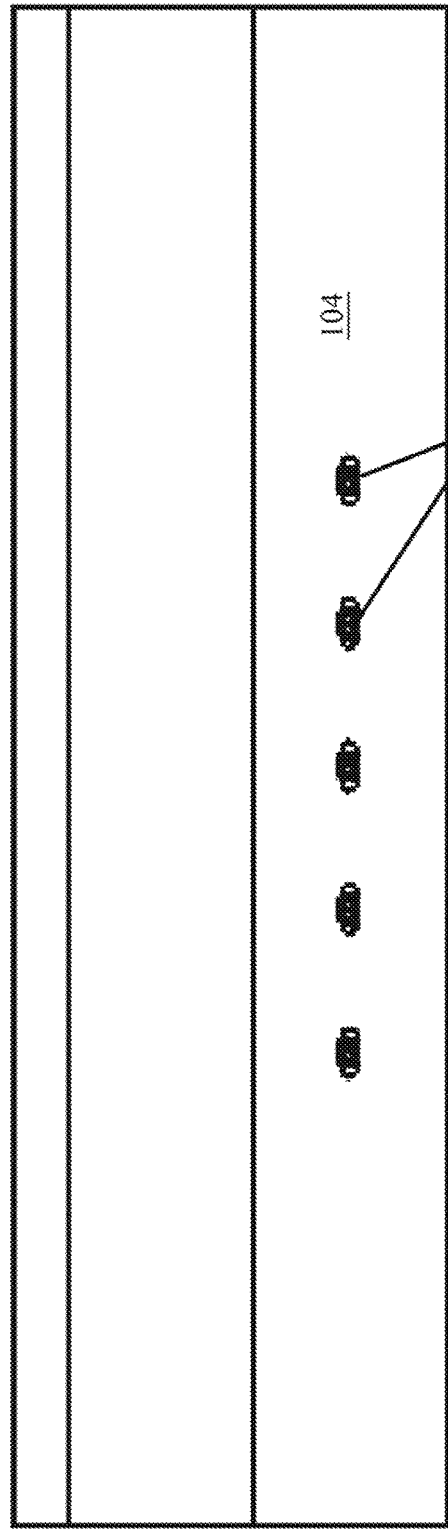

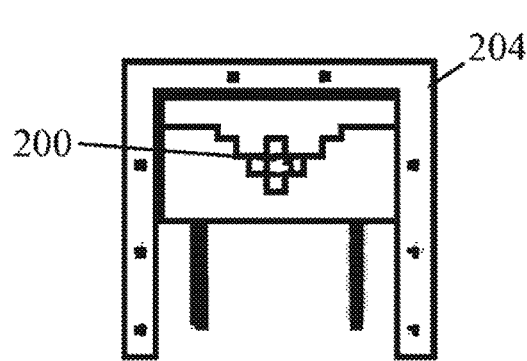
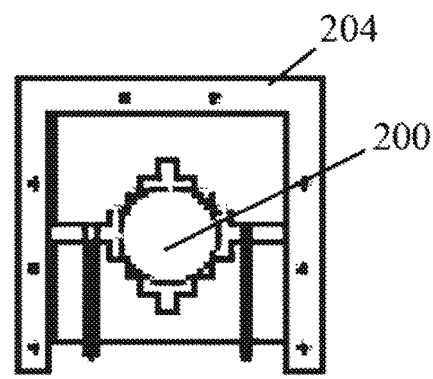
FIG. 9A　　　　　　FIG. 9B
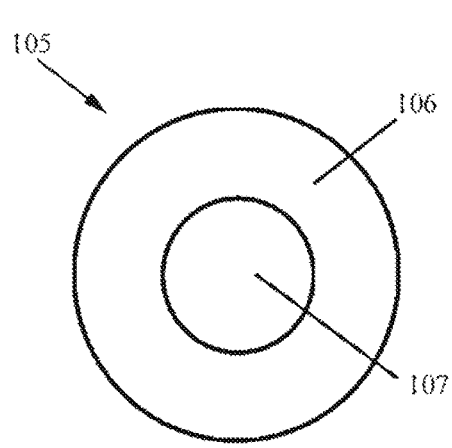
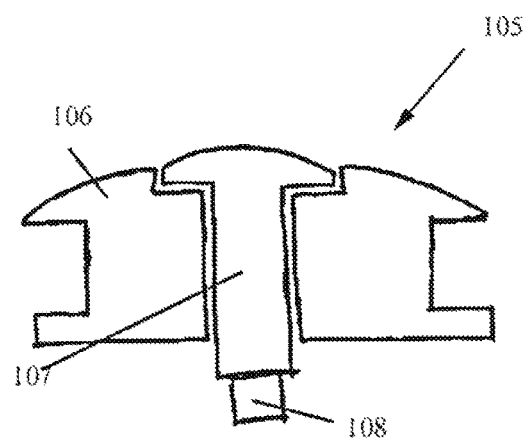
FIG. 10　　　　　　FIG. 11

ELECTRIC POWER METERING EQUIPMENT

CROSS-REFERENCE TO RELATED APPLICATION(S)

The present application derives priority from U.S. Provisional Patent Application 62/165,650 filed 22 May 2015.

BACKGROUND OF THE INVENTION

1. Field of the Invention

The present invention relates generally to a system for electrical power usage metering and, more specifically, to an improved system and equipment configuration for providing electrical metering functions directly on the power distribution line.

2. Description of the Background

In developed countries, electricity is supplied to homes and businesses via an electric power distribution system, or "grid", over which electricity is carried via high voltage transmission lines from a power generation station to one or more substations. From substations, electricity at a lower voltage is transmitted through distribution or service lines to individual customers, i.e. homes and businesses, throughout the distribution network. Commonly, the lower-voltage service lines that distribute power directly to individual customers take the form of overhead power lines supported by utility poles, which can support service lines from substations to within a few feet of the customer's home or business. In other areas, service lines are buried in insulated casings between substations and customers' premises. Power is supplied from the service line to the customer's premises through a "service drop" or "service lateral", i.e. a branch of the service line that extends from the main service line to the customer's premises.

In the United States and elsewhere, electric power generated by power plants is supplied to individual customers at a predetermined or market-driven rate, usually measured as a cost per kilowatt hour (kWh). In a conventional power distribution system, the cost of electricity for individual consumers is based on their individual energy consumption at each home or business at which power is supplied. Energy consumption for each premise is most commonly measured using an electricity meter connected to the service drop for those particular premises at the point where it enters the customer's property. The most common type of prior art electricity meter is an electromechanical meter, which measures electricity consumption by counting the revolutions of a metal disc, the speed of which is proportionate to the amount of electricity passing through the meter and into the premises due to the action of a set of electric coils on the disc. The number of rotations is mechanically tracked by the meter and recorded on a series of display dials, which must periodically be read manually by a representative from the power supplier to determine energy consumption for the property and bill the consumer accordingly.

More recently, energy suppliers and/or public utilities have begun to utilize electronic meters with some energy consumers. These more advanced prior art electricity meters electronically record energy consumption, allowing them to record additional energy consumption parameters such as peak or low consumption rates, correlate energy consumption to a time of day, etc. Prior art electronic meters typically display energy consumption via an electronic display on the unit itself. Although some newer "smart meters" are capable of transmitting energy consumption readings directly to the power supplier or public utility, others require in-person readings by an employee of one of these entities in order to obtain proper readings and bill the consumer accordingly.

As with each of the prior art electricity meters described herein, conventional electronic meters are installed upon the exterior or within the interior of the customer's home or business, usually affixed to a "meter base" or other structure on or in the consumer's property. Current power distribution systems do not comprise electricity meters capable of being mounted anywhere other than a meter base. When a power supply system is installed (or upgraded) in a home or business facility, the electricity meter is supplied by the energy supplier or utility company, which continues to own and maintain not only the electricity meter but also the service drop and distribution lines. The property owner, on the other hand, continues to own and maintain not only his or her real property and the structure(s) thereon to which power is supplied, but the "meter base" or any other structure to which the electricity meter is mounted and at which point the service drop is connected to the electricity system of the individual premises. In addition to original installation and/or upgrades to the power supply system of a given premises, the energy supplier or utility company must also perform regular and emergency maintenance and repairs, as well as routine safety checks, on the equipment owned by them. In areas where new construction of homes or businesses is ongoing, or where energy suppliers or utility companies are in the process of converting to updated metering installations, construction crews require ample access to power supply installations to perform these functions.

Prior art consumer power supply configurations requires that the property owner and/or tenant periodically allow access for representatives of the utility company or energy supplier to enter their property and/or premises and to work on equipment attached to portions of the structure owned by the property owner and/or adjacent to personal property of the owner or tenant. Moreover, for some maintenance issues and/or safety hazards associated with the energy distribution system, liability as between the property owner and the energy supplier and/or utility company may be unclear because the property owned by respective parties is so integrally connected. Thus, damage to the distribution line(s) and/or electricity meter(s) within or connected to the consumer's property may cause a dispute without a clear answer as to whether liability should rest on the supplier, based on installation or maintenance issues with the equipment, or the consumer, based on upkeep issues or lack of access granted to the supplier. In addition, electricity meters installed on the customer's property or inside of a customer's premises pose a danger to the consumer in the form of fire damage to the consumer or his property and electrical shock to persons in the vicinity, and are themselves susceptible to damage from tampering, vandalism, theft, low level flooding or other hazards that may be present on or in the consumer's property.

What is needed is an improved system for electric power distribution that provides a clear demarcation point between the equipment and installations owned and maintained by the consumer and that owned and maintained by the energy supplier and/or utility company. It would also be advantageous if such a system was arranged such that the equipment and installations owned and maintained by the energy supplier and/or utility company were accessible to representatives of that entity for maintenance, repair and upgrade without requiring the property owner to grant access to same, and without said representatives being required to enter onto or interfere with the consumer's property and/or premises to perform said work. Such an improved system would also advantageously allow energy suppliers and/or utility companies to monitor or read energy consumption levels remotely, or without entering onto the customer's property. Moreover, what is needed is an energy distribution system wherein individual components thereof can be added, removed or replaced as needed without the need to remove or replace the complete assembly or to enter onto the customer's premises and perform work on or within the consumer's property.

SUMMARY OF THE INVENTION

Accordingly, it is an object of the present invention to provide an improved electric power distribution system utilizing an improved electricity metering device that is capable of being mounted directly onto, and in line with, the distribution line/conductor at any point along the length thereof.

It is also an object of the present invention to provide such a system in which an improved electricity metering device can serve as a remote service switch (RSS) at various points along the energy distribution grid, based on design preference or safety considerations.

It is also an object of the present invention to provide such a system wherein the positioning of the electricity metering device creates a clear demarcation between property and equipment owned by the energy consumer, on one side, and by the utility company or energy supplier, on the other, such that liability and safety issues involving the respective property and equipment are more clearly couched with one party or the other.

It is also an object of the present invention to provide such a system in which the electricity metering device and surrounding electricity distribution equipment are modular to allow easy replacement or addition of component parts for same in the case of expansions or upgrades of the distribution grid.

These and other features and benefits are achieved with an improved electric power metering device that can be installed directly to and in the distribution line owned by a utility company or energy provider, whether for overhead or underground distribution lines. The improved electric power metering device according to the present invention thus solves many of the issues presented by prior art electricity meters that are installed in or on an individual consumer's premises, such as liability distribution and the potential for injury to the consumer or damage to the metering device based on the proximity of the metering device to the property of the consumer. The improved electric power metering device of the present invention may also be advantageously applied to the electricity distribution grid at various points that prior art meters may not be convenient or possible to install, such that service metering or RSS can be enacted at strategic points in the grid.

For a more complete understanding of the invention, its objects and advantages refer to the remaining specification and to the accompanying drawings.

BRIEF DESCRIPTION OF THE DRAWINGS

Other objects, features, and advantages of the present invention will become more apparent from the following detailed description of the preferred embodiment and certain modifications thereof, in which:

FIG. 1 is a front view of a fully-assembled device 100 (e.g., "quadrometer") comprising four distinct metering modules 10 as per FIG. 1.

FIG. 2 is a from view of a single metering module 10 according to the present invention.

FIG. 3 is a top view of the fully assembled quadrometer 100 of FIG. 2 as mounted on a service line 200.

FIG. 4 is a rear view of a fully-assembled quadrometer 100 comprising four distinct modules.

FIG. 5A is a top section view of a single metering module 10 to show the interior components thereof.

FIG. 5B is a bottom section view of a single metering module 10 to show the interior components thereof.

FIG. 6A is a top view of a single metering module 10 in which the locations of the source 102 and load 101 connectors are depicted.

FIG. 6B is a bottom view of a single metering module with flex button connectors.

FIG. 7 is a side section view of a single metering module 10 to show the interior components thereof.

FIG. 8 is a side view of a single metering module 10 on which the locations of flex buttons 105 are depicted.

FIG. 9A is a front view of a mourning bracket according to one aspect of the present invention.

FIG. 9B is a front view of an alternative mounting bracket according to another embodiment of the present invention.

FIG. 10 is a top view of a flex button connector 105 according to the present invention.

FIG. 11 is a side section view of a flex button connector 105 according to the present invention.

DETAILED DESCRIPTION OF THE PREFERRED EMBODIMENTS

FIG. 1 is an end or plan view of a fully-assembled quadrometer unit 100, which comprises a plurality (here four) individual modules 10, 20 attached together. FIG. 2 is a plan diagram of a single electric power monitoring device module 10 according to the present invention, viewed from the front or "source" side thereof. The terms "front" and "back" to describe facets of the inventive electric power monitoring device are used herein for clarity to refer to the "source" and "load" facing surfaces of the device, respectively. For purposes of description each assembled unit of modules is referred to herein as a quadrometer 100, while each quadrometer 100 comprises a plurality of individual modules chosen from among a metering module 10, communications module 20, or dummy module 30.

In the exemplary embodiment of FIG. 1 a total of three (3) metering modules 10 are combined with one (1) communications module 20, all mechanically attached and electrically-connected using flex buttons 105 (not seen in FIGS. 1-2, but described in more detail below with regard to FIGS. 5-6), in order to form one quadrometer 100.

Each metering module 10 is designed to monitor and track the electricity consumption for a particular circuit of an individual premises and/or consumer account. An individual premises usually employs two circuits, but one, two, or three circuits can be used for a single premises/customer. Moreover, a multi-conductor transmission line typically carries multiple "phases" of current, wherein each conductor carries a current having the same voltage and amplitude but with a phase difference of a fraction of a period. In a three-phase system, for example, three wires in the same transmission line carry three currents with a phase difference of ⅓ of a period relative to one another. The fully assembled quadrometer 100 can monitor and track multiple single-phase or three-phase service drops (containing one, two, or three circuits each) for each consumer.

FIG. 3 depicts a top view of the assembled quadrometer 100 installed on an energy distribution line 200. The energy distribution line as depicted herein comprises one or more distribution conductors 201 through which electrical current to be supplied to consumers flows, and one or more support or guide wires 202, but may also comprise one or more grounding wires, one or more transmission wires for other utilities or services, etc. As in the prior art, the distribution line may be supported at various intervals along its length by utility poles to feed distribution lines throughout the distribution network. Although illustrated herein as applied to an overhead distribution line, it will be understood that the present invention may also be applied to an underground distribution line or other electric utility installation as known in the art. The distribution line 200 depicted in FIG. 3 continues at the left edge of the page as viewed towards the power supplier or source (via or more transformers and/or substations), and continues to the right of the page as viewed towards the remainder of the distribution network, or load. Thus, in the top view shown, the back or load side of the quadrometer 100 faces to the right and the front or source side of the quadrometer 100 faces to the left of the page.

As shown in FIGS. 1 and 3, the assembled quadrometer 100 surrounds the distribution line 200, line 200 running centrally up through a central channel 203 through quadrometer 100, with the source and load sides of the quadrometer 100 corresponding to source and load sides of the distribution line 200. Reference characters 101 and 102 show the locations of load and source connector points, respectively, inside the housing of each metering module 10 at respective source and load ends thereof. Likewise, FIGS. 2 and 4 depict the assembled quadrometer 100 as viewed from the source and load sides, respectively, where the connector points 102 and 101 are exposed to receive terminal ends of the distribution conductor 201 or service drop, as described herein.

As described above, each quadrometer 100 is formed of a total of four component modules: up to three metering modules 10, plus one or more communication 20 and/or placeholder or dummy modules 30 (not shown) as desired. A front view of an exemplary metering module 10 is shown in FIG. 1. Each of the component modules forming the quadrometer 100 comprises a housing 103, preferably formed of an insulating material that surrounds and protects the remainder of the module's components. In some preferred embodiments, housing 103 may be multi-layered to provide both insulating and strengthening properties. With reference to FIGS. 2 and 6A-6B, housing 103 generally forms an elongate enclosure having a uniform cross-section along its length in the shape of an irregular hexagon or trapezoid having 45 degree angled corners to provide a perpendicularly-angled abutment against a neighboring module likewise disposed at a 90 degree angle relative thereto. The remaining long edge of each module 10 is referred to as the "top" of the module herein, while the shorter segment bordered by the two angled corners is referred to as the "bottom" of the module 10. The abutment or "connection surface" 104 formed by the extension of the angled corner segments along the length of the module 10 is designed to abut a neighboring module, and a plurality of flex buttons 105 releasably lock two opposing connection surfaces 104 together to secure modules 10 in place. The quadrometer 100 is thus formed from the connection of surfaces 104 of four modules in 90 degree rotational increments relative to each other such that the tops of each module are exposed outwardly away from the center of the quadrometer 100 and the bottom surfaces of the four modules combine, leaving a central channel 203 (see FIG. 4) there between through which distribution line 200 may be mounted.

FIGS. 9A-9B depict a mounting bracket 204 that is mounted inside channel 203 to support and contain distribution line 200, as applied to differently-sized distribution lines 200 in FIGS. 9A and 9B. Any configuration consisting of two or more modules 10 will require a mounting bracket 204. Mounting bracket 204 preferably comprises a guillotine-type-clamp bracket with two opposing jaws as illustrated slidably-mounted within a square frame. The jaws have notches to embrace and seat a range of diameters of distribution line, although one skilled in the art will understand that other suitable cable fixation device may suffice. Mounting bracket 204 is preferably temporarily affixed to the bottoms of three of the individual modules in channel 203 via screws or other releasable fastening means known in the art to allow individual modules to be removable and replaceable within quadrometer configuration 100 as described herein. Mounting brackets 204 may contain an adjustable mounting hardware mounted with springs, bolts or the like to allow the actual line mounting hardware to expand to accept different diameters of distribution line. Alternatively, mounting brackets 204 can be provided in a plurality of rigid sizes, wherein the energy supplier or utility company responsible for installing quadrometers 100 can choose the best-sized bracket 204 for the given application.

In a preferred embodiment, as described above, quadrometer 100 is formed from the combination of three metering modules 10 and one communications module 20, but one or more placeholder or "dummy" modules 30 (not shown) may comprise an empty housing 103 of the same shape and size as metering 10 and communications 20 modules to serve as a stand in to fill out the four-sided configuration of the quadrometer 100 as the power distribution network expands or where fewer than three metering modules 10 are required due to the layout of the distribution network. In an alternative embodiment, instead of three metering modules 10 and one communications module 20 in each quadrometer 100 configuration, four metering modules 10 may be joined where one or more quadrometers 100 are linked in series such that a single communications module 20 may serve each of the linked metering modules. In yet another alternative embodiment, four metering modules 10 may be joined where each of the individual metering modules can perform the functions of the communications module 20, as will be described, or where remote meter reading is not required in a given location. It will be understood that alternative communications modules 20, having more, fewer, or different components known in the art than herein described, may be utilized based on the desired capabilities of the overall device, such for metering communications only and where RSS is not required.

Cutaway views of an individual metering module 10 from the top and bottom are shown in FIGS. 5A and 5B, respectively. As shown therein, metering modules 10 each comprise two source connection points 102 at the source end thereof, and one or more load connection points 101 at the load end thereof. Source connection points 102 may be a standard dual power distribution terminal block (or two single blocks), and load connection point 101 may be a single block. In a preferred embodiment, metering modules 10 also comprise a current transformer (CT) 11, a remote service switch (RSS) 12 and various communication wires 13 to interface with adjacent metering modules 10 and communications module 20. CTs 11 measure current or energy consumption as it flows through a set of coils, wherein current flowing through a primary coil induces a corresponding, measurable current in a secondary coil via a magnetic core. CTs 11 may be commercially-available revenue-grade CTs such as commonly used for driving an electrical utility's watt-hour meter for three-phase or single-phase services greater than 200 amperes. RSS devices 12 are essentially remote "power switches" within electronic metering devices which allows an energy supplier or utility company to remotely turn on or turn off the supply of power flowing through it to a consumer's premises for safety reasons or during transitions in ownership or occupancy in the premises.

In one preferred embodiment, metering modules 10 used without a communications module 20 may additionally contain a remote computing device (not shown) and wireless communication means (not shown) for recording, displaying, and/or transmitting energy consumption parameters to a remote location. In the preferred embodiment, each metering module 10 is operatively linked to a communications module 20 via communication wires 13, through which metering modules 10 transmit energy consumption parameters from current transformers 13 to a transducer/meter combination in the communications module 20. The communications module 20 also houses the a remote computing device and automatic meter reading (AMR) platform of choice for transmitting consumption, diagnostic, and status data from the on-board meter to a central database for billing, troubleshooting, and analyzing. There are a variety of suitable wired or wireless communication means for recording, displaying, and/or transmitting energy consumption parameters to a remote location by radio frequency, cellular or via power line communication, and a cellular solution such as McCrometer CONNECT® is presently preferred. Such remote computing and wireless communication devices may have functionalities similar to the "smart" energy meters known in the art, such as correlating energy consumption parameters to a time of day or specific date, capturing peak or low energy consumption parameters, wirelessly transmitting energy consumption parameters to a remote location or uploading them to a communications network for access by one or more parties, etc. Communications modules 20 or metering modules 10 may also optionally comprise an energy regulating device to allow power suppliers or utility companies to control the maximum amounts of power supplied to an individual premises or to an entire distribution network to lower the cost of energy distribution or control the strain on the distribution network during times of peak usage, emergency, or the like. In a preferred embodiment, each communications module 20 (or, where no communications module 20 is used, each metering module 10) additionally comprises a Bluetooth® device to allow energy suppliers, utility companies, or individual consumers to monitor the energy usage of an individual premises or a network of consumers in real time. Also in a preferred embodiment, each metering 10 and communications module 20 may be equipped with one or more function indicators, such as LEDs 14 to indicate on/off status, information transmission and/or proper functioning.

In use, each quadrometer 100 will replace single phase, two phase, or three phase prior art electricity metering devices, with or without or advanced metering infrastructure (AMI), in a single, fully enclosed unit comprising up to four metering modules 10 that can be easily added, removed, or reconfigured as needed. Moreover, the metering modules 10 assembled into quadrometer 100 are installed directly onto and in line with the distribution line 200 itself, prior to or directly on the service drop or service lateral that extends from the distribution line 200 to an individual customer's premises. Thus, upon entering the customer's premises, typically through a "weatherhead" or other protective covering, the distribution conductor 201 can be connected directly to the customer's service or breaker box, without the need for the service provider or utility company to install or maintain any equipment inside the customer's premises. This inventive configuration provides several advantages to both the consumer and the service provider/utility, such as: (1) the quadrometer 100 provides a clearly defined demarcation point between property owned and maintained by the consumer vs. the energy provider/utility company, providing much clearer liability and maintenance obligation determinations; (2) the service provider/utility company is not required to install any property on the customer's premises, resulting in less chance of damage to the customer's real or personal property and a greatly reduced exposure of representatives from the service provider/utility company to unknown hazards or variables on the consumer's premises; (3) the customer is not required to grant access to any representative from the service provider/utility company to install, repair or inspect any equipment; (4) the risk of electric shock to the consumer or other members of the public from electric metering devices mounted inside the customer's premises is lessened; (5) the risk of fire damage to the consumer's premises from electric metering devices mounted inside the customer's premises is lessened; (6) the risk of damage to the electrical metering device from interior fire, low level flooding, vandalism, tampering, etc. is lessened; (7) the risk of electrical power theft is lessened; and (8) the need for the service provider/utility company to inspect consumer-owned equipment prior to and after the installation of electrical metering equipment, to ensure that the equipment is property supported and protected, is eliminated.

Upon the upgrade of the electricity metering devices for one or more customers in a given service area, or the initiation of service to one or more customers, the energy supplier or utility company (depending on local regulations) will locate or install the overhead or underground distribution line that services the consumers' premises. As described above, a single quadrometer 100 can provide electricity metering functions for up to four distinct customers, with one module allocated to metering functions for a single customer. Accordingly, the quadrometer 100 is preferably installed at a location along the distribution line where up to four service drops can conveniently be located. If needed, however, multiple modules can be used to track the energy consumption of a single customer utilizing multiple circuits. Also as described above, the quadrometer 100 may advantageously be installed in a modular fashion, with one or more placeholder modules 30 being installed and later replaced with metering modules 10 or communications modules 20 as needed. For concentrated distribution networks, such as apartment buildings or townhouses, several quadrometers 100 may also be installed in series, wherein one communications module 20 may advantageously provide the communications and computing functions for all neighboring metering modules 10.

After determining the proper configuration of the quadrometer 100 to be installed, the installing technician simply installs the appropriate mounting bracket 204 on the service line 200 at the appropriate location, and then mounts the required modules of the quadrometer 100 installation by securing them each to the mounting bracket and to the neighboring modules through flex buttons 105.

Flex buttons 105 are shown in top view in FIG. 10 and in side cross section in FIG. 11, wherein the "top" of each button 105 is that surface that is exposed on the angled connection surfaces 104 of each module. Each flex button 105 comprises a silicon impregnated rubber "washer" 106 having a round top cross section and a central channel there through in which a conductive spine 107 is disposed. At the bottom end of spine 107, a conductive wire connection point 108 is mounted. When the top of flex button 105 is butted up to another flex button 105, the top of the flexible washer 106 will flex downward towards the wire connection point 108, providing a "touch"-type connection between adjacent modules. Flex buttons 105 are mounted on the angled connection surfaces 104 of adjacent modules, as shown in FIG. 8, for easy installation, configuration and replacement of several different modules in a modular fashion as the distribution grid grows. In the alternative, the quadrometer 100 can arrive on site fully assembled for mounting by the technician, thereby saving money for the energy supplier/utility company. When not installed in a three-phase modular fashion, the technician will also be required to install a placeholder module 30 alongside neighboring modules to ensure proper communication between them.

Once mechanically installed on the service line 200, the technician may connect the terminal source end or ends of the distribution conductor 201 to the source connector 102 on the one or more metering modules 10 making up the quadrometer 100, and the terminal load end or ends to the load connector 101 of the metering modules 10. Additional load connectors 101 can serve as a connection point between the metering module 10 and the consumer's premises, i.e. for the service drop or service lateral.

In addition to the above-described process of mounting quadrometers 100 proximate a consumer's premises for individual service metering, quadrometers 100 may also be advantageously installed at any point along the distribution or transmission lines of a power supply grid, based on design preference, monitoring needs, or safety considerations. For example, a single quadrometer 100 may be installed at the head of the distribution line that services an entire apartment building, so that the owner or property manager may easily track energy usage for the entire building or so that the service provider/utility company has a single safety shutoff (where the quadrometer is provided with an RSS device) to cut power to the entire building in the case of emergency, for repairs, etc. In addition, quadrometers 100 may advantageously be installed at the transformer station pull-off, such that power can be removed along the length of the complete distribution line for a given service area using a single device.

Having now fully set forth the preferred embodiments and certain modifications of the concept underlying the present invention, various other embodiments as well as certain variations and modifications of the embodiments herein shown and described will obviously occur to those skilled in the art upon becoming familiar with said underlying concept. It is to be understood, therefore, that the invention may be practiced otherwise than as specifically set forth in the appended claims.

We claim:

1. A modular power distribution monitoring apparatus, comprising:
    a plurality of metering modules attached together and each comprising,
    a source input terminal block for electrically connecting a source distribution line,
    an output terminal block for electrically connecting a load distribution line,
    a current transformer, and
    a housing enclosing said source input terminal block, output terminal block, and current transformer, said housing further comprising an elongate walled enclosure having a uniform cross-section along its length in the shape of one of a trapezoid or irregular hexagon, said housing including a front wall, rear wall parallel to said from wall, and side walls defined by a surface diagonal to both said front wall and rear wall thereby providing a connection surface abutting an adjoining metering module.

2. The modular power distribution monitoring apparatus according to claim 1, wherein both side walls further comprise two angled surfaces.

3. The modular power distribution monitoring apparatus according to claim 2, wherein both side walls further comprise two 45 degree angled surfaces.

4. The modular power distribution monitoring apparatus according to claim 3, wherein both side walls intersect said front wall at 45 degrees.

5. The modular power distribution monitoring apparatus according to claim 4 wherein both side walls intersect said rear wall at 90 degrees.

6. The modular power distribution monitoring apparatus according to claim 1, further comprising a plurality of fasteners penetrating each side wall of each housing of each metering module for attaching adjoining metering modules together.

7. The modular power distribution monitoring apparatus according to claim 6, wherein each of said plurality of fasteners releasably attaches adjoining metering modules together.

8. The modular power distribution monitoring apparatus according to claim 7, wherein each of said plurality of fasteners comprises a rubber fastener.

9. The modular power distribution monitoring apparatus according to claim 8, wherein each of said plurality of fasteners comprises a flex button including a rubber fastener and a conductive member penetrating said rubber fastener.

10. The modular power distribution monitoring apparatus according to claim 9, wherein each said conductive member comprises a head at one end and a wire connector at another end.

11. The modular power distribution monitoring apparatus according to claim 1, wherein the cross-section shape of said housing comprises an irregular hexagon shape.

12. The modular power distribution monitoring apparatus according to claim 1, further comprising a communications module having a current meter connected to said plurality of metering modules, a remote communication transmitter connected to said current meter, and a housing enclosing said current meter and transmitter, said housing further comprising an elongate walled enclosure having a uniform cross-section along its length in the shape of a trapezoid defining a front wall, rear wall, perpendicular side walls, and angled corner walls intersecting said front wall and side walls at 45 degrees, said corner walls thereby providing a connection surface abutting an adjoining metering module.

13. The modular power distribution monitoring apparatus according to claim 12, wherein said plurality of metering modules comprise three metering modules attached together with said communications module in a quadrangle defining a central channel passing there between.

14. The modular power distribution monitoring apparatus according to claim 13, further comprising a clamp bracket mounted within said central channel for securing one or both of said source distribution line and load distribution line.

15. The modular power distribution monitoring apparatus according to claim 1, further comprising a dummy module comprising an elongate walled enclosure having a uniform cross-section along its length in the shape of an irregular hexagon defined by a front wall, rear wall, perpendicular side walls, and angled corner walls intersecting said front wall and side walls at 45 degrees, said corner walls thereby providing a connection surface abutting an adjoining metering module.

16. A modular power distribution monitoring apparatus, comprising:
   a plurality of metering modules attached together and each comprising,
   a source input terminal block for electrically connecting a source distribution line,
   an output terminal block for electrically connecting a load distribution line,
   a current transformer, and
   a housing enclosing said source input terminal block, output terminal block, and current transformer, said housing further comprising an elongate walled enclosure having a uniform cross-section along its length in the shape of one of a trapeoid or irregular hexagon defined by a front wall, rear wall, perpendicular side walls, and angled corner walls intersecting said front wall and side walls at 45 degrees, said corner walls thereby providing a connection surface abutting an adjoining metering module.

17. The modular power distribution monitoring apparatus according to claim 16, further comprising a plurality of fasteners penetrating each corner wall of each housing of each metering module for attaching adjoining modules together.

18. The modular power distribution monitoring apparatus according to claim 17, wherein each of said plurality of fasteners releasably attaches adjoining modules together.

19. The modular power distribution monitoring apparatus according to claim 17, wherein each of said plurality of fasteners comprises a flex button.

20. The modular power distribution monitoring apparatus according to claim 19, wherein each of said plurality of flex buttons comprises a unitary rubber grommet held captive in holes penetrating each corner wall of each housing.

21. The modular power distribution monitoring apparatus according to claim 16, further comprising a communications module having a current meter connected to said plurality of metering modules, a remote communication transmitter connected to said current meter, and a housing enclosing said current meter and transmitter, said housing further comprising an elongate walled enclosure having a uniform cross-section along its length in the shape of an irregular hexagon defined by a front wall, rear wall, perpendicular side walls, and angled corner walls intersecting said front wall and side walls at 45 degrees, said corner walls thereby providing a connection surface abutting an adjoining metering module.

22. The modular power distribution monitoring apparatus according to claim 16, further comprising a clamp bracket for mechanically securing cables electrically connecting adjoining modules together.

23. The modular power distribution monitoring apparatus according to claim 22, further comprising a dummy module comprising an elongate walled enclosure having a uniform cross-section along its length in the shape of an irregular hexagon defined by a front wall, rear wall, perpendicular side walls, and angled corner walls intersecting said front wall and side walls at 45 degrees, said corner walls thereby providing a connection surface abutting an adjoining metering module.

* * * * *